United States Patent
Bugaris et al.

(10) Patent No.: US 9,921,260 B2
(45) Date of Patent: Mar. 20, 2018

(54) VOLTAGE INDICATOR WITH CONTINUITY CHECK

(71) Applicant: Panduit Corp., Tinley Park, IL (US)

(72) Inventors: Rachel M. Bugaris, Lexington, KY (US); John C. Senese, Naperville, IL (US); Craig T. Hoeppner, Bolingbrook, IL (US); James E. Fabiszak, Darien, IL (US); Richard A. Rago, New Lenox, IL (US); Masud Bolouri-Saransar, Orland Park, IL (US); Ronald A. Nordin, Naperville, IL (US); Nekheel S. Gajjar, Chicago, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 15/104,074

(22) PCT Filed: Dec. 16, 2014

(86) PCT No.: PCT/US2014/070644
§ 371 (c)(1),
(2) Date: Jun. 13, 2016

(87) PCT Pub. No.: WO2015/095216
PCT Pub. Date: Jun. 25, 2015

(65) Prior Publication Data
US 2016/0313386 A1    Oct. 27, 2016

Related U.S. Application Data

(60) Provisional application No. 61/919,321, filed on Dec. 20, 2013, provisional application No. 61/979,758, filed on Apr. 15, 2014.

(51) Int. Cl.
*G01R 31/02* (2006.01)
*G01R 19/155* (2006.01)
*H04B 3/46* (2015.01)

(52) U.S. Cl.
CPC ......... *G01R 31/026* (2013.01); *G01R 19/155* (2013.01); *G01R 31/02* (2013.01);
(Continued)

(58) Field of Classification Search
CPC ...... G01R 31/00; G01R 31/02; G01R 31/021; G01R 31/024; G01R 31/025;
(Continued)

(56) References Cited

U.S. PATENT DOCUMENTS 3,899,735 A    8/1975 Singer
4,398,188 A    8/1983 Feigal et al.
(Continued)

FOREIGN PATENT DOCUMENTS

GB    2317707 A    4/1998

*Primary Examiner* — Hoai-An D Nguyen
(74) *Attorney, Agent, or Firm* — Christopher S. Clancy; James H. Williams; Christopher K. Marlow

(57) ABSTRACT

A system for testing electrical continuity of a device to a source wherein there is at least one conductor connecting the device to the source can include a reference capacitive load, an oscillator, and a microprocessor. The oscillator is selectively connected to the reference capacitive load and each conductor connecting the device to the source such that the frequency output of the oscillator is a function of the selected capacitive load of the oscillator. Each conductor connecting the device to the source is connected to the oscillator such that when each one is selectively connected, the output of the oscillator is a function of that conductor's parasitic self-capacitance. The microprocessor can then compare the frequency of the signal generated when each conductor is connected to the oscillator with the frequency of the signal generated when the reference capacitive load is connected.

9 Claims, 11 Drawing Sheets

(52) U.S. Cl.
CPC .......... *G01R 31/021* (2013.01); *G01R 31/024* (2013.01); *H04B 3/46* (2013.01)

(58) Field of Classification Search
CPC .. G01R 31/026; G01R 31/1272; G01R 23/00; G01R 19/00; G01R 19/145; G01R 19/15; G01R 19/155; H04B 3/00; H04B 3/02; H04B 3/46
USPC ....... 324/500, 537, 539, 540, 600, 602, 605, 324/606, 629, 647, 679, 76.11, 76.41, 324/134, 135
See application file for complete search history.

(56) References Cited

U.S. PATENT DOCUMENTS

| | | |
|---|---|---|
| 4,812,752 A | 3/1989 | Preuss |
| 4,870,343 A | 9/1989 | Dooley et al. |
| 6,075,688 A | 6/2000 | Willard et al. |
| 6,703,938 B1 | 3/2004 | Clarke |
| 8,013,613 B2 | 9/2011 | Allen, Jr. |
| 2006/0061368 A1 | 3/2006 | Furse et al. |
| 2010/0174495 A1* | 7/2010 | Pereira .................. F16L 11/127 702/34 |
| 2011/0022338 A1* | 1/2011 | Gafvert ................ G01R 31/027 702/65 |

* cited by examiner

VOLTAGE INDICATOR WITH CONTINUITY CHECK

FIELD OF THE INVENTION

The present invention relates generally to connectivity indicators and specifically to voltage indicators and testers with a system to validate the connectivity of the voltage indicator for the purpose of verifying the measurement is valid.

BACKGROUND OF THE INVENTION

Within industry, indicators are often used to convey the status of a signal or information that is being monitored. Indicators are often utilized to communicate the presence of a particular signal or state. However, in order for the absence of a signal to be indicated with any certainty, additional verification is required.

When attempting to indicate the absence of a signal with any certainty, positive indication is required. This is particularly important when using an electronic indicator, such as a light emitting diode. For instance, an indicator could be used to indicate the presence of a signal such as power, voltage, communication, etc. by illuminating when the signal is present. However, if the indicator is not illuminated assuming that the signal is not present, although true in some instances, would not be accurate all of the time. There are several possible scenarios to consider: the indicator may have failed or reached the end of its life; one or more components in the circuitry comprising or controlling the indicator may have failed; or the connection between the signal and the indicator may be detached or severed. Therefore, in order to verify the validity of a signal with any degree of confidence and to positively indicate that absence, continuity between the signal source and indicator must be established and confirmed.

One application for this type of positive indication of the absence of a signal deals with voltage detection. Prior to performing de-energized work on electrical equipment, workers are required to verify that the equipment is in an electrically safe state. Until proven otherwise, one must assume that the equipment is energized and take all necessary precautions, including utilizing appropriate personal protective equipment (PPE). One part of the verification of an electrically safe work condition involves a test for the absence of voltage. This test is performed by a trained and qualified electrical worker using an adequately rated voltage tester, usually a portable voltmeter or multimeter. The electrical worker first tests his meter on a known, energized source to ensure it is working properly. He then verifies that voltage is absent in the electrical equipment by metering phase-to-phase and phase-to-ground. Finally, he re-tests his meter on a known, energized source to ensure it is still functioning properly and wasn't damaged during the test. Although voltage verification is an NFPA 70E requirement and considered a best practice, the test itself still presents a hazard because workers are exposed to energized circuits and conductors when using the voltage tester during the live portions of the test and it relies on humans to follow a process, verifying the meter functionality before and after use. Thus, a permanently installed device that is able to detect the presence and verify the absence of primary (single- or multi-phase AC or DC) voltage, provide a means of testing itself, and positively indicate the status of voltage in a particular electrical compartment would be useful for this type of application.

SUMMARY OF THE INVENTION

A system for testing electrical continuity of a device to a source wherein there is at least one conductor connecting the device to the source can include a reference capacitive load, an oscillator, and a microprocessor. The oscillator is selectively connected to the reference capacitive load and each conductor connecting the device to the source such that the frequency output of the oscillator is a function of the selected capacitive load of the oscillator. Each conductor connecting the device to the source is connected to the oscillator such that when each one is selectively connected, the output of the oscillator is a function of that conductor's parasitic self-capacitance. The microprocessor can then compare the frequency of the signal generated when each conductor is connected to the oscillator with the frequency of the signal generated when the reference capacitive load is connected.

In one embodiment the reference capacitive load is an additional conductor in the same cable as the conductor(s) connecting the device to the source, but wherein the additional conductor is not itself connected to the source.

DETAILED DESCRIPTION OF THE PREFERRED EMBODIMENTS

Figure 1:
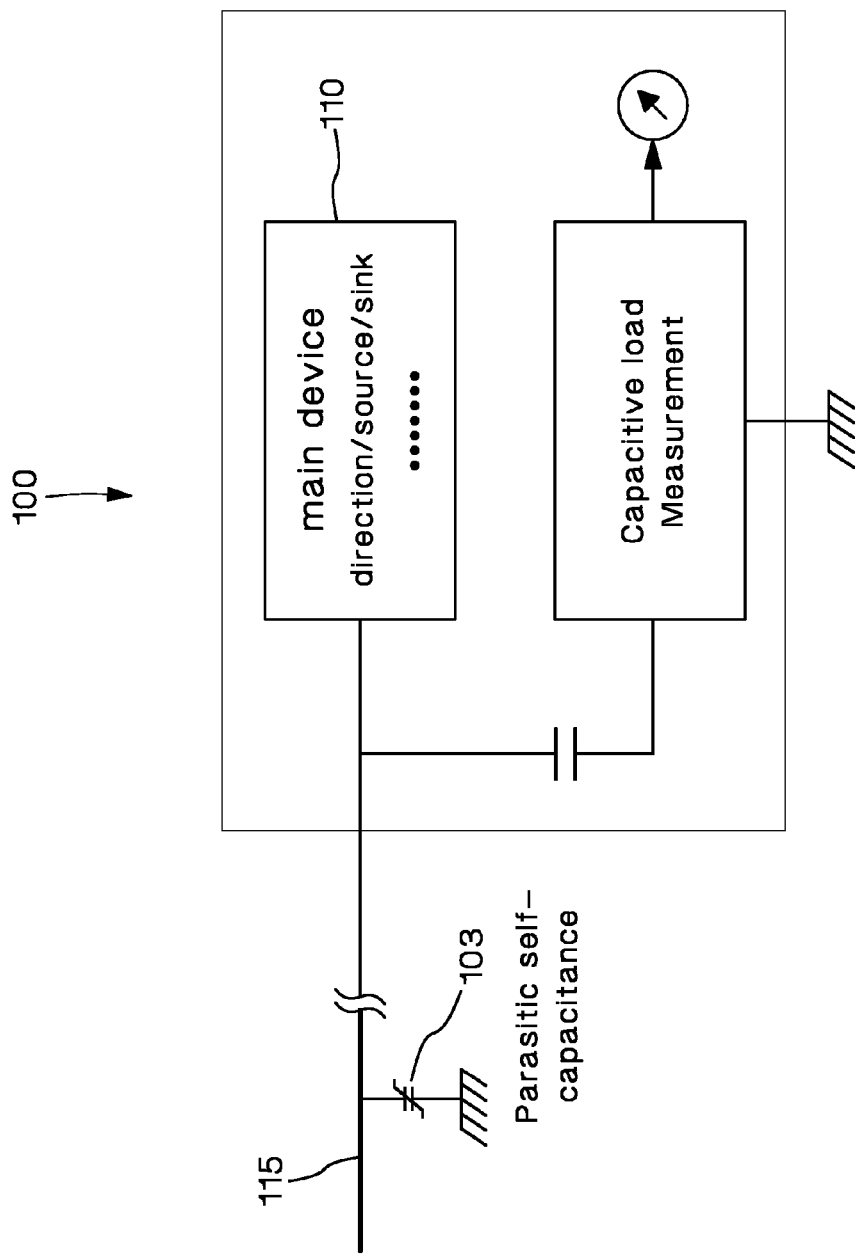
FIG. 1 is a block diagram of a system of determining connection to a main line by measuring the capacitive load such as a parasitic self-capacitance.

One of the key steps to verifying the absence of a signal is to perform a check to verify that the detection method or scheme is actually measuring the signal and has not unknowingly been disconnected. FIG. 1 shows a system 100 to detect the connectivity of a main device 110 to a main signal line 115 by sensing and interpreting its parasitic self-capacitance 103.

Figure 2:
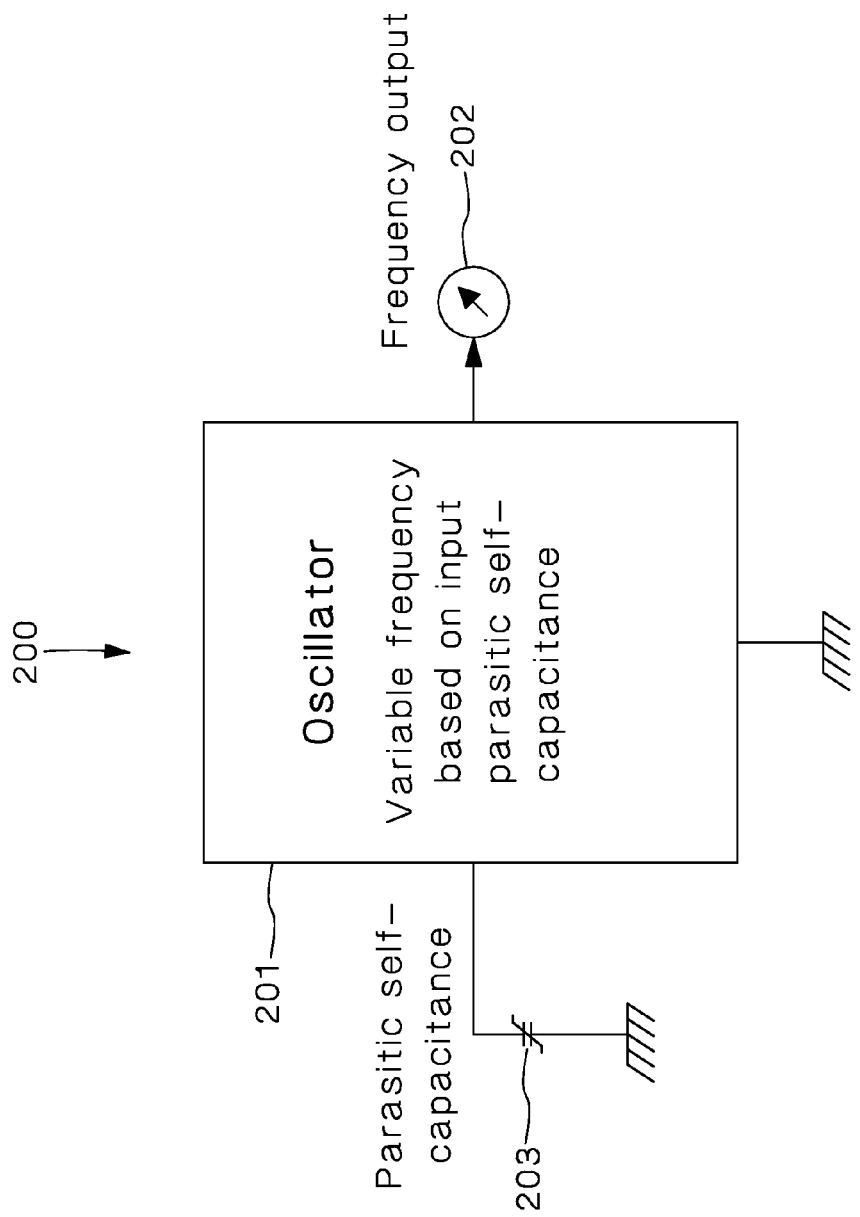
FIG. 2 is a block diagram of an oscillating circuit that has an output frequency which varies as a function of the parasitic self-capacitance.

FIG. 2 shows a system 200 that uses an oscillator 201 with a frequency output 202 being a function of a parasitic self-capacitance 203. Since the frequency output 202 of the oscillator 201 is a function of the parasitic self-capacitance 203, when the input or parasitic self-capacitance 203 changes, the frequency output 202 will shift as well. As a result, by monitoring the frequency output 202 and comparing it with a base or calibration frequency, a main device can know whether the signal lead is connected.

Figure 3A:
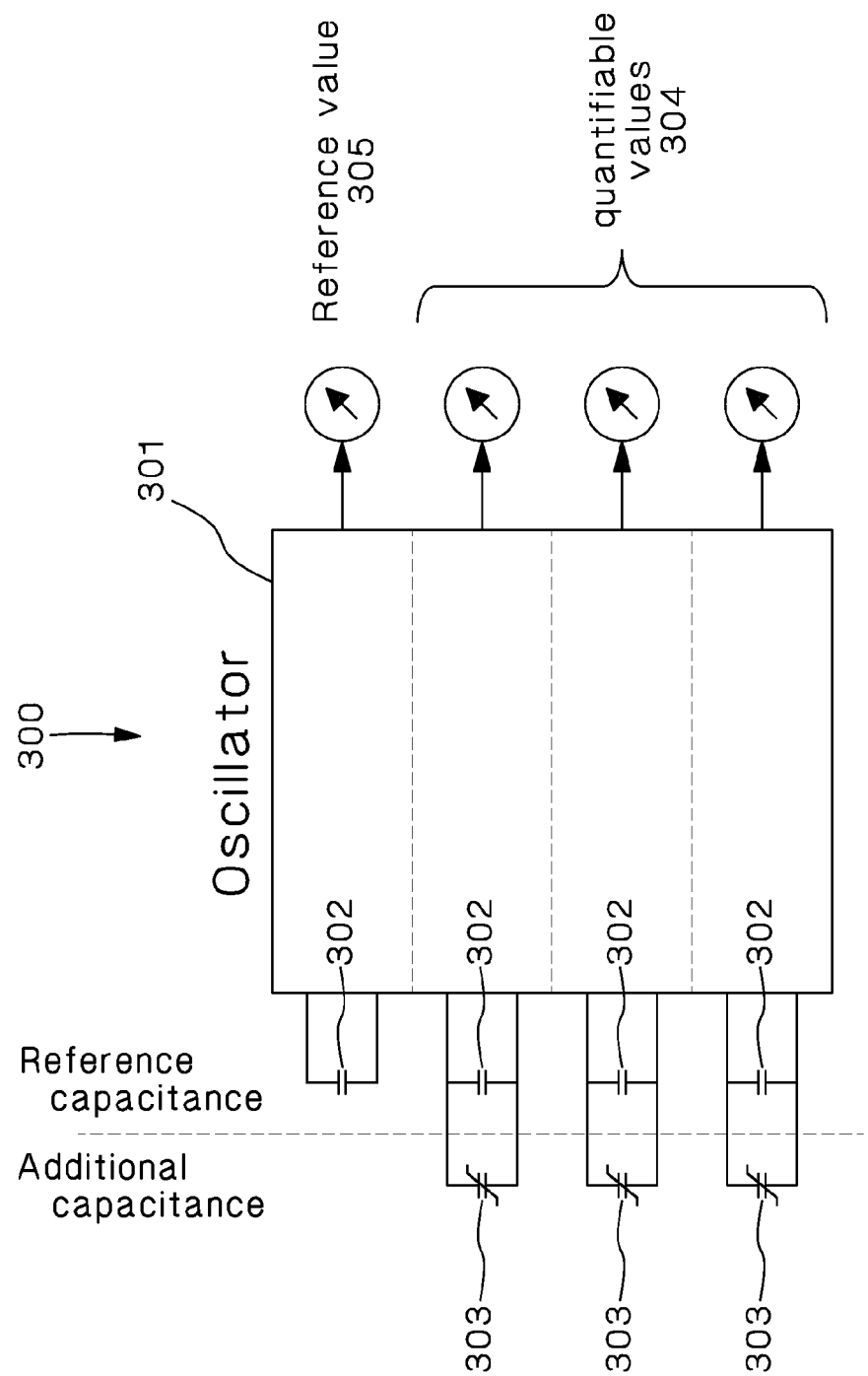
FIG. 3A is a block diagram of a system that uses a frequency reference in order to determine an unknown capacitive load such as a parasitic self-capacitance.

FIG. 3A shows one embodiment of a system 300 that checks for continuity and obtains a base or calibration frequency via a reference value 305. FIG. 3A shows using reference capacitance 302 on all sensing input for the oscillator 301 in combination with a set of additional or variable capacitive loads 303 on all lines excluding at least one. The input(s) with only a reference capacitance 302 can be used as the reference value(s) 305 in order to achieve self-calibration of the system 300. The quantifiable values 304 (the ones in which the inputs are also connected to the additional or variable capacitance 303) can then be compared to the reference value 305 in order to determine whether the inputs are indeed connected to the additional or variable capacitance 303.

Figure 3B:
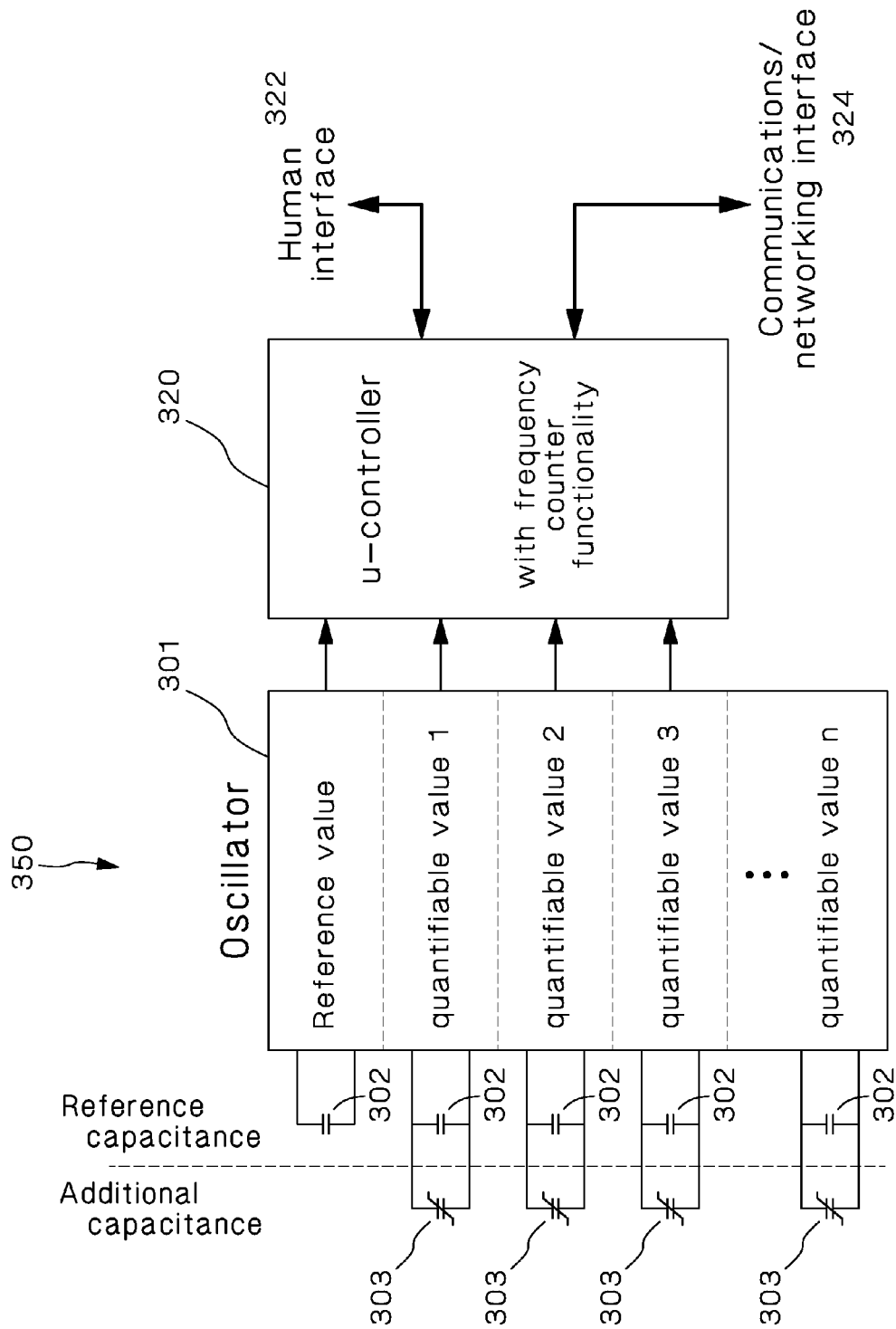
FIG. 3B is a block diagram of the system of FIG. 3A further incorporating a microcontroller.

In one embodiment, the oscillator 301 can be combined with a microcontroller (microprocessor) 320 as shown in FIG. 3B. FIG. 3B shows a first alternate system 350 similar to the system 300 of FIG. 3A except it allows for anywhere from 1 to n number of quantifiable values in addition to the reference value 305 and it combines the microcontroller 320 with the oscillator 301. This allows the counting of the frequency and examination of the change in the parasitic self-capacitive load possible by comparing one of the quantifiable values with the reference value 305 with the microcontroller 320. The microcontroller 320 can be connected to a human interface 322 or a communications or networking interface 324 such as a safety system or a monitoring or control network.

Figure 3C:
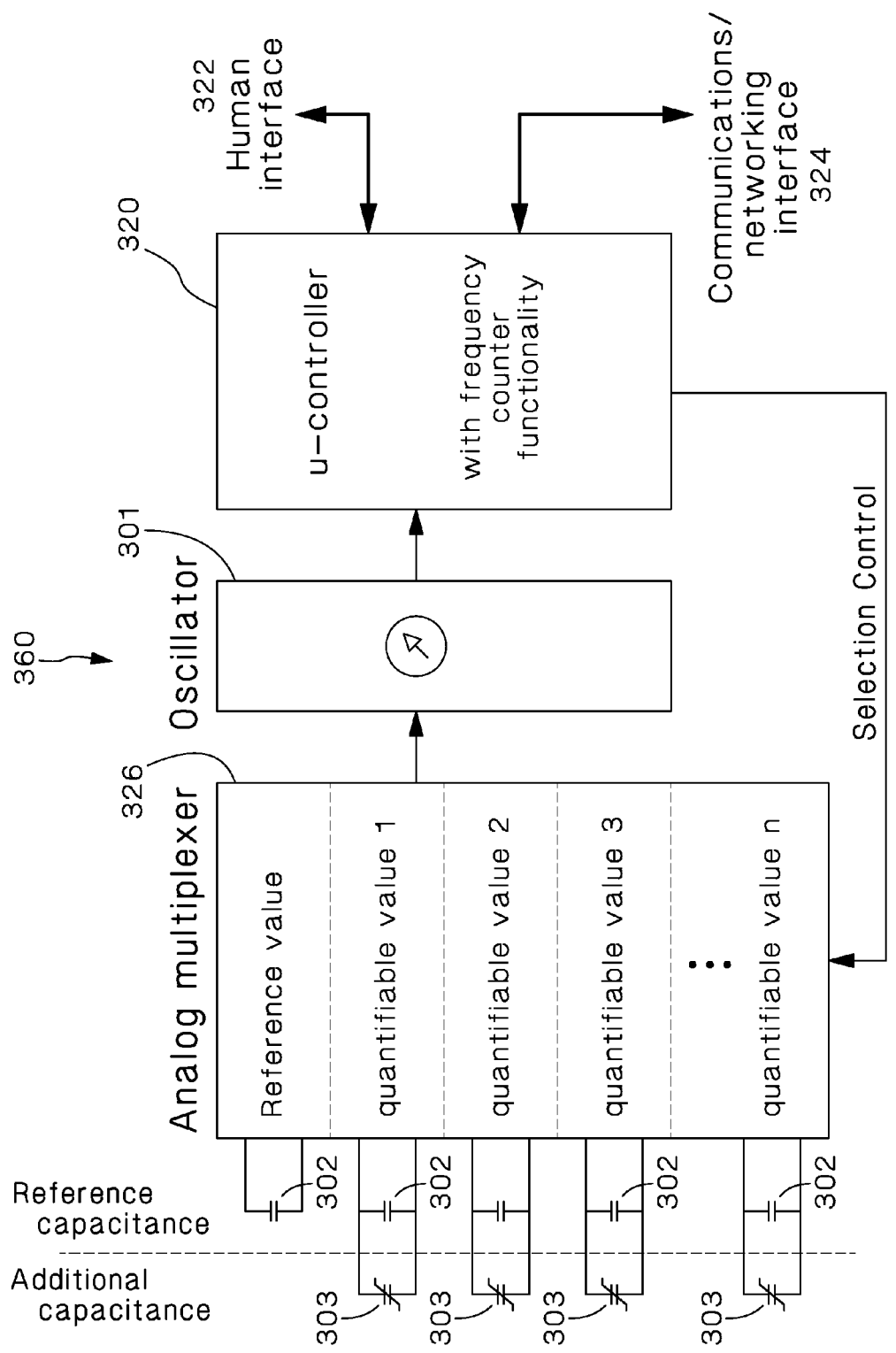
FIG. 3C is a block diagram of the system of FIG. 3B further incorporating an analog multiplexer.

In another embodiment, the precision of the system can be increased by further combining the oscillator 301 with an analog multiplexer 326 as shown in the second alternate system 360 of FIG. 3C. The selected connectivity from the analog multiplexer 326 will shift the frequency of the oscillator 301. This technique improves the precision by eliminating the tolerance within multiple oscillators. The selection of an input channel can be controlled by the microprocessor 320.

The frequency of the oscillator 301 can be fairly high and there is a weak probability that the length of a conductor under test can fall close to a half or multiple wavelength of the base frequency of the oscillator 301 and cause issues with the detection scheme. In order to remedy this issue, the oscillator 301 can be configured to operate in multiple base frequencies as shown in a third alternate system 370 in FIG. 3D.

Figure 3D:
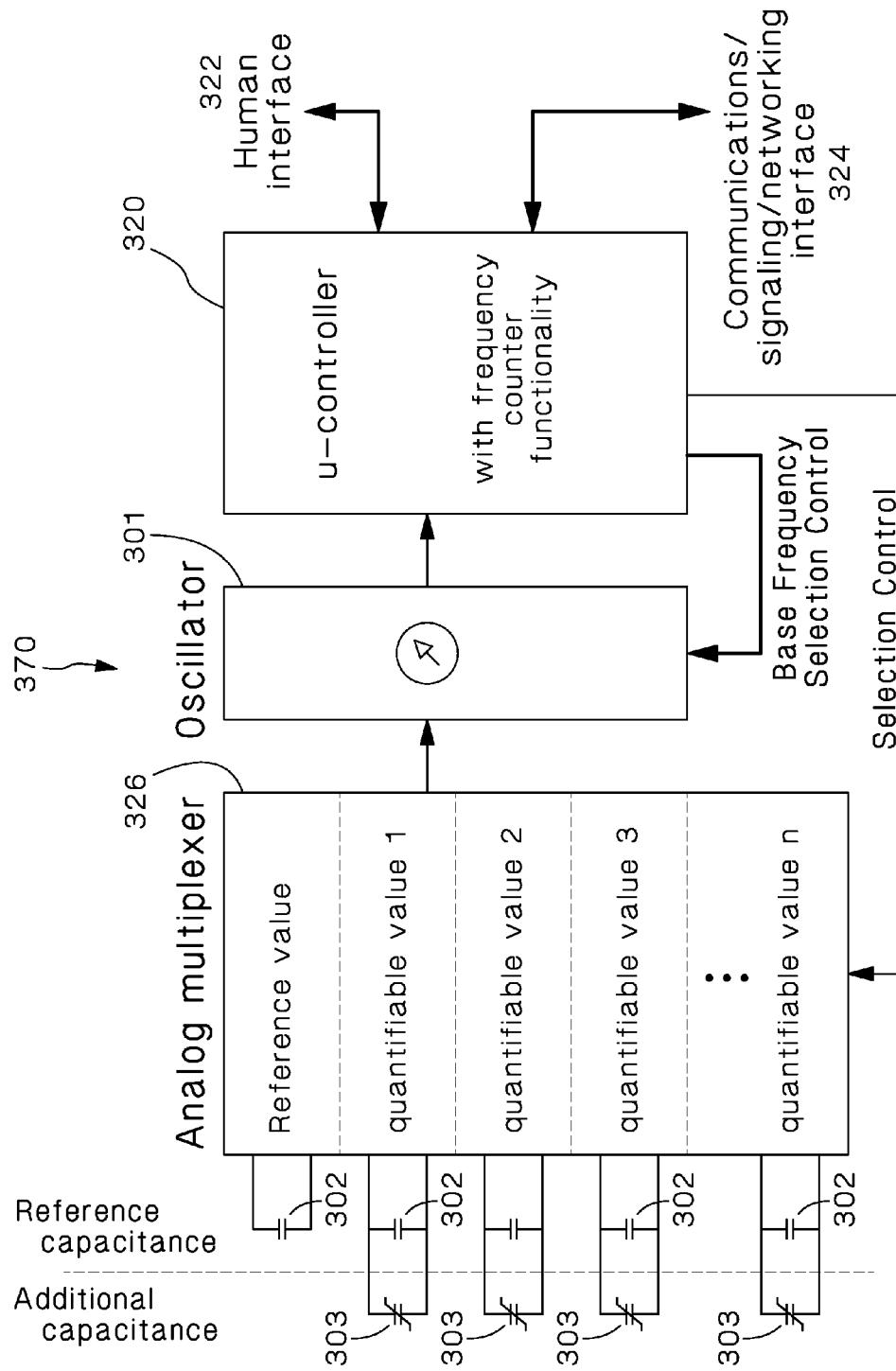
FIG. 3D is a block diagram of the system of FIG. 3C further implementing an oscillator capable of operating in multiple base frequencies.
Figure 4A:
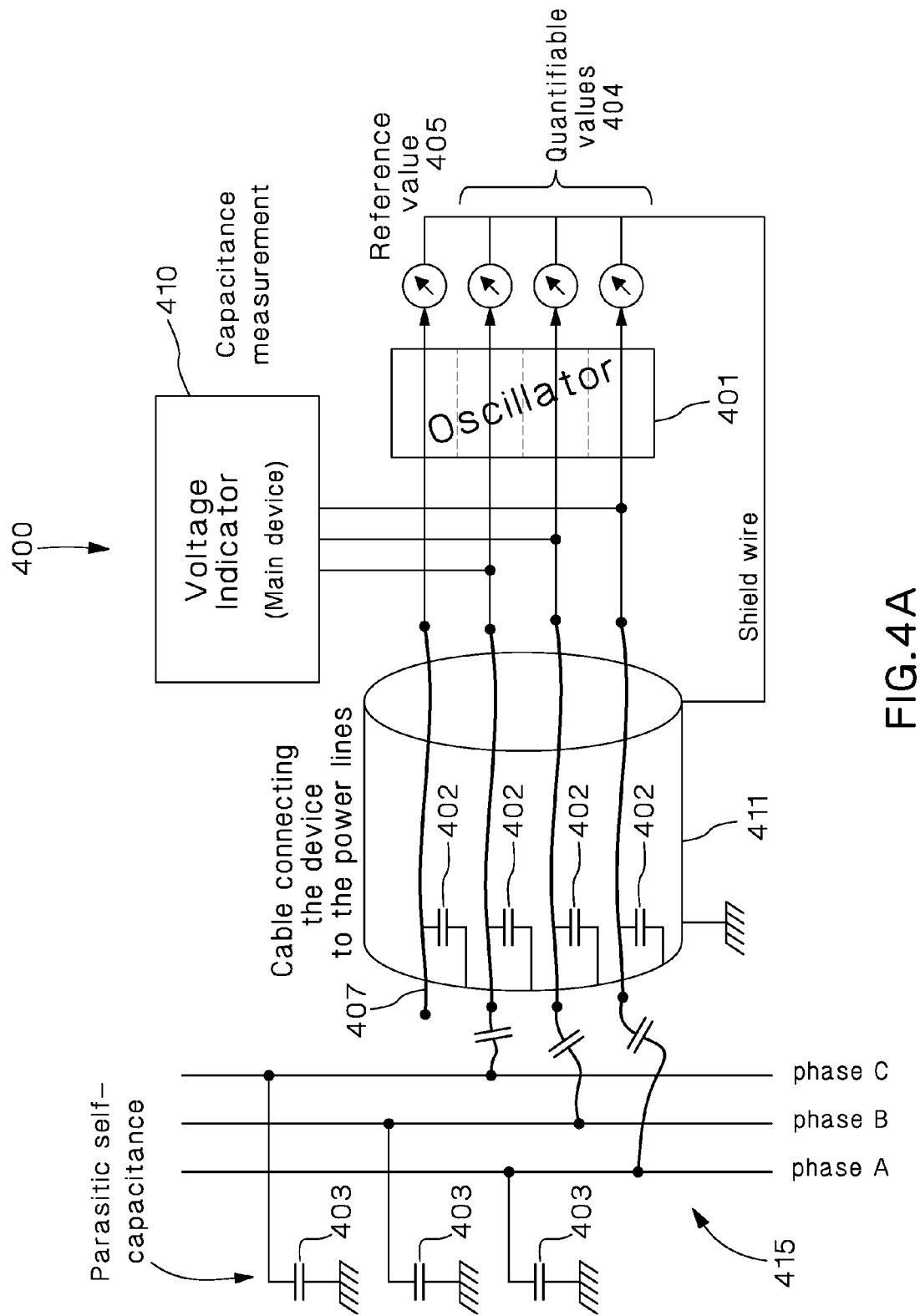
FIG. 4A is a block diagram of a representative system that uses an oscillating circuit with a calibration wire in order to determine connectivity to a power line.

FIG. 4A shows one embodiment of a system 400 for checking the continuity of a main device 410 such as a voltage indicator. In this embodiment, a shielded cable 411 containing four conductors is wired towards a three-phase power source 415 to be monitored by the main device 410. Three of the four conductors are connected to the three-phase power source 415, one for each phase, the remaining conductor is left unconnected to any power source in order to be used as a calibration wire 407 in order to determine a reference value 405. The reference value 405 can be used for calibration and to normalize the measurement of the cable length, temperature, and other variables. Referring back to FIGS. 3A-D, the cable parasitic self-capacitance 402, or the capacitance to ground for each conductor due to the cable 411, would be similar to the reference capacitance 302 from FIGS. 3A-D, and the power parasitic self-capacitance 403, the capacitance to ground for each conductor due to the connection to the three-phase power source 415, would be similar to the additional or variable capacitive loads 303 in FIGS. 3A-D. Using the oscillator 401, an output value is obtained for each of the conductors connected to the power source 415 (the quantifiable values 404) and for the reference value 405. The frequency of each output value will be based upon each conductor's capacitance relative to ground. The output values of the conductors connected to the power source, the quantifiable values 404, are then compared to the reference value 405. If the conductors for the quantifiable values 404 are indeed connected to the power source 415 then their capacitance to ground should be substantially different than that of the calibration wire 407, resulting in output signals for the quantifiable values 404 having a substantially different frequency than the reference value 405. However, if one of the quantifiable values 404 has an output frequency similar to the reference value 405 then that conductor is not connected to the power source 415.

Figure 4B:
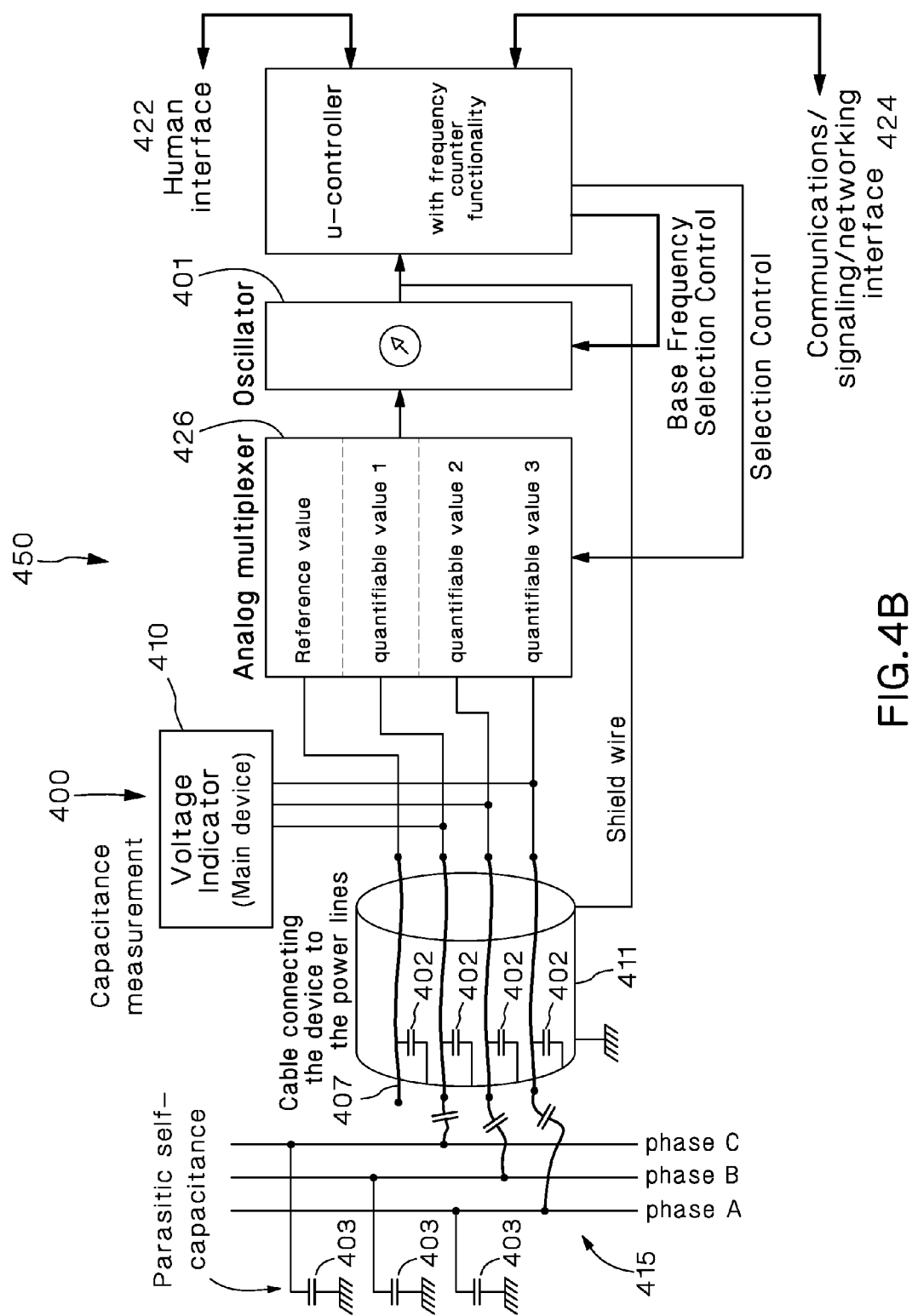
FIG. 4B is a block diagram of the system of FIG. 4A further incorporating the microcontroller and analog multiplexer of FIGS. 3B and 3C and further implementing the oscillator capable of operating in multiple base frequencies of FIG. 3D.

FIG. 4B shows an alternate embodiment of a system 450 for checking the continuity of a main device 410 such as a voltage indicator which is similar to the system 400 of FIG. 4A except that it incorporates the analog multiplexer 426, microcontroller 420, and oscillator 401 with multiple base frequencies shown in FIGS. 3B-D and described above.

Another embodiment uses ground wires with an unshielded cable to obtain the capacitance to ground for each conductor as noted above.

The above described connectivity check can be used in a device designed to detect both the presence and absence of voltage. This allows workers to test for the absence of voltage and to receive verified indication that voltage is not present before opening an electrical enclosure. The purpose of such a device is to detect the presence and verify the absence of primary (single or multiple phase ac or dc) voltage. The device will visually indicate whether voltage is present or absent while the panel is closed via an indication module mounted through the panel.

Figure 5:
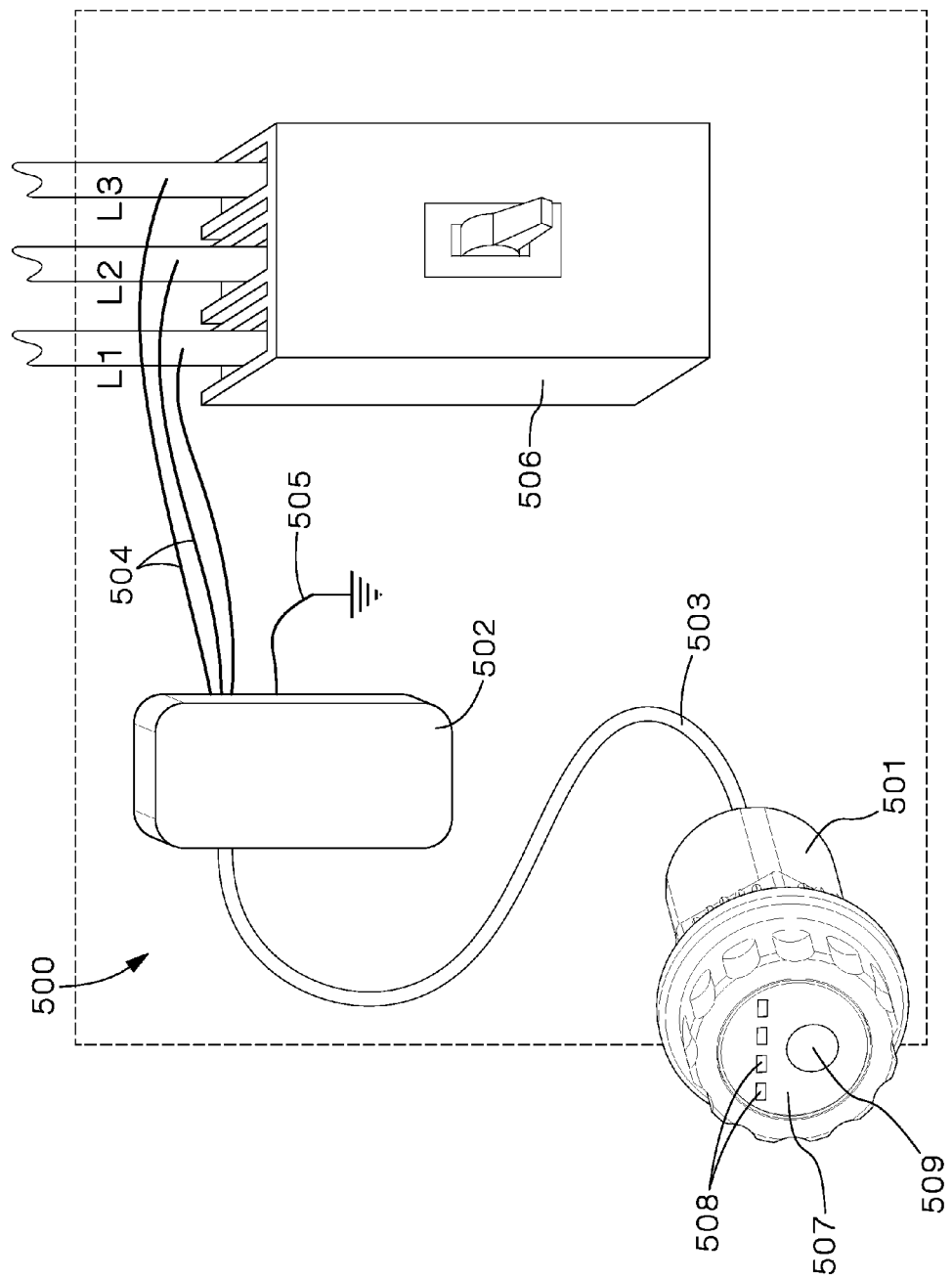
FIG. 5 is a generalized perspective view of a device for the indication of voltage with a system for checking the continuity.
Figure 6:
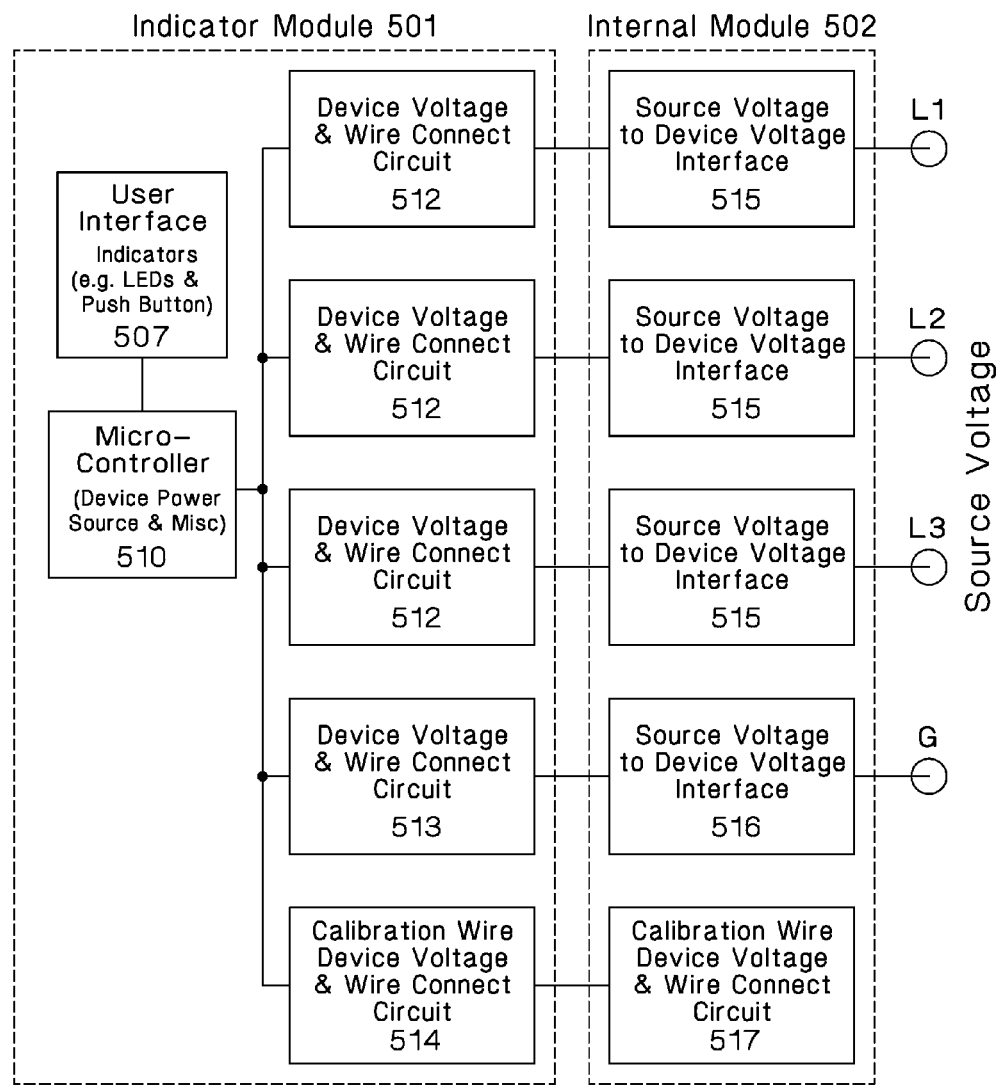
FIG. 6 is a hardware block diagram describing the functionality of the device of FIG. 5.

FIGS. 5 and 6 show one embodiment of such a device 500. The device 500 has an indication module 501, an internal module 502, a multi-conductor system 503, power attachment leads 504 with attachment terminals and a ground lead 505 with an attachment terminal. In one embodiment, the device has three output states: voltage is present (red LED(s) illuminated on indicator module), voltage is not present and the absence of voltage has been verified (green LED illuminated), and unknown or malfunctioning device (no LEDs illuminated). Note that in other embodiments any variety or combination of appropriate indicators may be used in lieu of the LEDs mentioned.

As shown in FIG. 5, the power connection leads 504 can be formed of three separate wires. Each wire can be approximately the same length and can be pre-terminated at one end (inside the internal module 502). The other end of the power connection lead 504 will be free and can have a pre-installed attachment connector. The attachment connector can be used to facilitate a connection to three-phase power within the electrical panel. When the device is installed, one power connection lead 504 will be hardwired to each phase (L1, L2, L3) of a power source (line or supply side). For typical applications the power connection leads 504 can be installed upstream (line/supply side) or downstream (load side) of an electrical disconnect 506 within the panel (the present embodiment of the invention is compatible with either option.) The attachment connector is designed to facilitate a secure connection of the power attachment leads 504 to the power conductor, regardless of the diameter or style of the power conductor. Attachment types can include, but are not limited to, standard wire terminals, adjustable width blade terminals, conductive flags wrapped around the conductor, insulated sleeves, vampire clamps or any other acceptable wiretapping, joining, or splicing connections.

The ground lead 505 can be similar to the power connection leads 504. It can be factory terminated at one end (inside the internal module 502), and will have a free end with an optional factory installed terminal to allow for easy attachment to ground (G) when the device 500 is installed within a panel.

The internal module 502 is the portion of the device 500 that is the interface between connection leads (the power connection leads 504 and the ground lead 505) and the multi-conductor system 503. The internal module 502 can include circuitry used to transform each phase of the three-phase power source voltage to a non-hazardous level device voltage (less than 50 Vac, less than 60 Vdc is generally considered non-hazardous; approximately 10 Vac is the preferred embodiment). This is an important function because it ensures that any power or signal transmitted through the multi-conductor system 503 to the indicator module will be a safe level and not present an electrical shock hazard. The internal module 502 can have provisions to be DIN rail mounted or surface mounted to a flat surface within the enclosure. In one embodiment, the internal module 502 has an indicator that will signal (i.e. visual, audible) when primary three-phase voltage is present. The internal module 502 may or may not be potted or conformally coated.

The multi-conductor system 503 can include at least 5 wires (L1, L2, L3, G, and a calibration wire). The calibration wire can be used to obtain a reference value in the connectivity check using a system similar to the one described above and shown in FIGS. 4A and B. At one end of the multi-conductor system 503, each wire will be factory terminated within the internal module 502. The other end of the cable will connect to the indication module 501 via a connector. The connector may be factory installed (if pre-determined cable lengths are offered) or the connector can be provided, to be installed in the field once the multi-conductor system 503 has been cut to the appropriate length.

The indication module 501 consists of the circuitry designed to detect, verify, and indicate the voltage state of the three-phase circuit. In one embodiment of the device we may also indicate the continuity to ground. The indication module circuitry may also contain circuitry that records the time/date the test was initiated and the resulting signal indicated by the module when it is activated. The indication module 501 can be permanently mounted through an electrical panel, most likely a door or cover. The preferred embodiment can use a standard knockout, possibly a 30 mm circular knockout. Other embodiments however may not be permanently mounted and instead be portable. The internal side of the door or cover can house a mating connector or socket interface for the multi-conductor system 503. The external side can include a user interface 507. In one embodiment, the user interface can include a group of LEDs 508 of various colors that illuminate to indicate status. The user interface can also include a test button 509 or other means of activating the device. The indication module 501 can also house a separate power source, such as a battery. (It is possible for other power sources to be utilized such as rechargeable batteries, ultra capacitors, hybrid concepts, or network power. It is also possible that these alternate power sources and their associated circuitry, as well as any combination of the detection, verification, and indication circuitry could be housed in the internal module 501.) The indicator module 501 can include a removable cap feature that allows battery replacement and device maintenance to be completed on an installed device from outside the electrical panel without opening the panel or exposure to electrical hazards.

FIG. 6 is a hardware block diagram showing the placement of some of the connections and components of the device 500 in regards to their placement in either the indicator module 501 or the internal module 502. In this embodiment, the user interface 507, micro-controller 510, and device voltage and wire connect circuits for each phase 512, ground 513, and calibration wire 514 are in the indicator module 501 (alternatively, much of the circuitry contained in the indicator module 501, such as the micro-controller 510 and wire connect circuits 512, 513, 514 can also be located in the internal module 502). The source voltage to device voltage interface for each phase 515, ground 516, and calibration wire 517 are contained in the internal module 502. FIG. 6 also shows the micro-controller 510 containing the oscillator connected to the device voltage side of each phase (L1, L2, L3) and ground (G) wire. The output frequency of the oscillator is dependent upon the value of the input capacitance. Referring back to FIG. 5, when the input of this circuit, the power connection leads 504, is attached to a wire or terminal such as a disconnect 506, the capacitance changes resulting in an output frequency shift. By monitoring the frequency and knowing the base or calibration frequency (obtained from the calibration wire), the micro-controller 510 will know if the wire lead is connected or open circuited.

Figure 7:
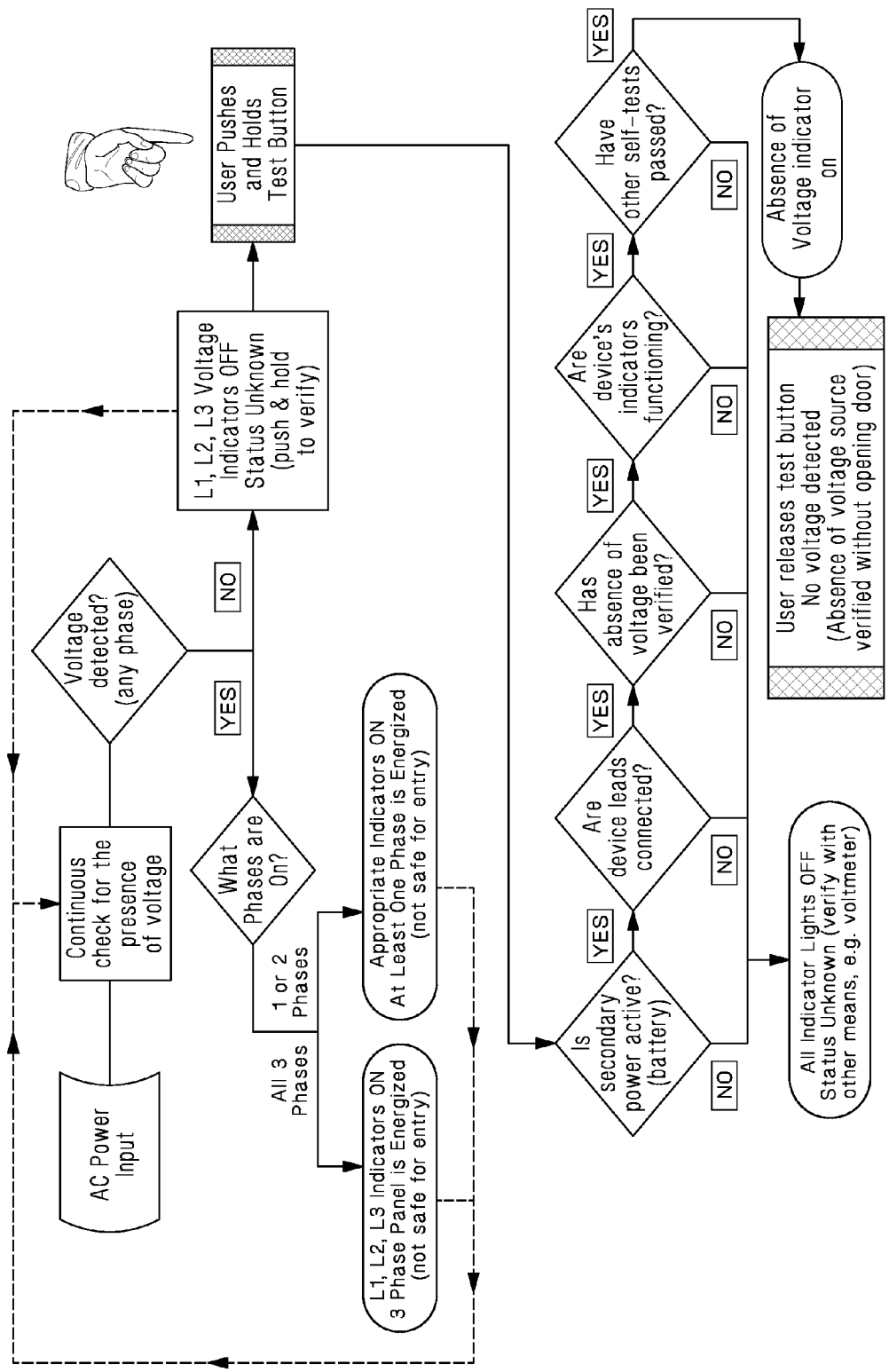
FIG. 7 is a flow-chart showing the internal logic of the device of FIG. 5.

Referring to FIG. 7, a flow-chart detailing the internal logic of the device 500, to indicate the presence of voltage, if voltage is present in any phase, indicators will signal on the indicator module 501 (e.g. LED(s) 508). For this, the device 500 can derive its power from the circuit that is being monitored. This can be done automatically and without user interaction. Once the user activates the device (by pushing a button is this embodiment) it should be noted that the decision tree may not necessarily take place in the sequence indicated and that further checks may be added to ensure safety and reliability.

To indicate the absence of voltage, the device 500 utilizes a separate power source, such as a battery, an ultra-capacitor, or network power (power-over-Ethernet, for example). In one embodiment, before the absence of voltage is indicated, the display can be activated by depressing and holding the test button 509 on the indication module 501. This will initiate a series of internal tests and checks to verify that no voltage is present on the main circuit and the device is operating as intended. In alternative embodiments of the device other means of activating the device may include but are not limited to, remote activation, non-contact activation (e.g. hand waving).

It is important to note that in order to indicate the absence of voltage with any certainty, a positive indication must be used. It is simply not enough to assume that voltage is not present because the voltage presence indicators (red LEDs in this embodiment) are not illuminated; there are several failure methods that must first be considered. For example, if the red LEDs are not illuminated it could because the red LEDs have failed or reached the end of their life and voltage is present, one or more of the components in the detection and indication circuitry have failed and voltage is present, the connection between the circuit being monitored and the indicator has failed, been cut, or otherwise become disconnected at some point and voltage is present, and/or power has been disconnected at an upstream point in the electrical distribution scheme and voltage is indeed not present. In the above scenarios, all but the last example would result in dangerous situations if one was to assume that voltage was not present due to lack of a signal from the voltage presence indicator. Most prior art typically operates in this manner, only the presence of voltage is usually indicated.

In order to verify the absence of voltage, the separate power source is used in conjunction with verification circuitry. One of the key steps to verifying that voltage is not present is to perform a check to verify that the voltage detector is actually measuring the primary circuit and has not been unknowingly disconnected. As shown in FIG. 7, a user can initiate this test by pressing the test button. As was previously described, one method to accomplish the continuity check is by the use of an oscillator circuit monitored by a micro-controller(s) comparing the capacitance of the power connection leads to a reference value.

An alternative method to check continuity can be accomplished by connecting to the primary phase in at least two places and using the phase conductor to complete the circuit. If the lead is disconnected an open circuit condition will result. If this method is used, the individual leads for each individual phase may be in separate cables and installed in any location on the incoming conductor between the point it enters the enclosure and the electrical disconnect (for certain applications it is possible to install downstream of the electrical disconnect). Alternatively, the leads for each individual phase may be in a single cable and installed on the incoming conductor with a single connector.

A voltage indicator under the present application may contain a memory unit that records the time, date, and status of the device when the device was interrogated (i.e. the button was pushed to initiate a test). This could be a useful feature for auditing purposes. For example, this feature would allow a supervisor, regulator, etc. to verify that a test was being performed to ensure voltage was not present. It would also indicate if the device truly gave a reading indicating there was an absence of voltage. In this way, if there was an accident the memory in the device could be used to determine if this was a user error, device error, undocumented change to the electrical panel being worked on, etc. and corrective actions could be taken.

The present application has generally described a voltage indicator as a device permanently installed on an electrical system. This is a preferred embodiment; however, it is possible to implement the technology used for voltage detection, verification testing, and indication as a portable or semi-portable modular system. A modular design with portable elements would allow the device to be tested on other known voltage sources. It is possible to permanently install a portion of the system on individual electrical enclosures and then use a single portable element to interface with the portion of the device installed in one or more electrical enclosures.

In some embodiments, the voltage detector may have the capability to perform a self-test. Such a test may be initiated automatically or upon a prompt from a user input to test electronic circuitry such as the internal memory, oscillators, and other components or systems, etc. to ensure the device and internal circuitry and software is performing as expected and will produce an accurate result. In the event that a discrepancy is discovered during the self-test, the device will not indicate the absence of a signal.

While particular embodiments and applications of the present invention have been illustrated and described, it is to be understood that the invention is not limited to the precise construction and compositions disclosed herein and that various modifications, changes, and variations may be apparent from the foregoing without departing from the spirit and scope of the invention as described.

The invention claimed is:

1. A system for testing the electrical continuity of a device to a source through a cable containing at least one conductor connecting the device to the source comprising:
    a reference capacitive load;
    an oscillator selectively connected to the reference capacitive load and to the at least one conductor, the oscillator configured such that a frequency output of the oscillator is a function of a selected capacitive load connected to the oscillator, the at least one conductor connected to the oscillator such that a frequency output of the oscillator when the at least one conductor is connected is a function of a parasitic self-capacitance of the at least one conductor; and
    a microprocessor connected to the oscillator, the microprocessor configured to compare a first frequency output, the first frequency output being a frequency of a signal generated when the at least one conductor is selectively connected, with a second frequency output, the second frequency output being a frequency of a signal generated when the reference capacitive load is selectively connected wherein the cable further contains a reference conductor in addition to the at least one conductor and further wherein the reference conductor is not connected to the source and a parasitic self-capacitance of the reference conductor is used for the reference capacitive load.

2. The system of claim 1 wherein the at least one conductor and the reference capacitive load is selectively connected to the oscillator via a multiplexer.

3. The system of claim 2 wherein the source is a three-phase power-source.

4. The system of claim 2 wherein the source is a power source.

5. The system of claim 3 wherein the at least one conductor comprises three conductors, each conductor of the three conductors connected to a different line of the three phase power source and each conductor of the three conductors selectively connected to the oscillator via the multiplexer.

6. A method for determining the electrical continuity of a device to a source through a cable containing at least one conductor connecting the device to the source comprising:
    providing an oscillator with a frequency output that is a function of a capacitive load connected to the oscillator;
    selectively connecting a reference capacitive load to the oscillator;
    selectively connecting a first conductor of the at least one conductor of the cable to the oscillator such that a frequency output of the oscillator is a function of a parasitic self-capacitance of the first conductor; and
    comparing a reference frequency output, the reference frequency output being a frequency of a signal generated by the connection of the reference capacitive load, with a first frequency output, the first frequency output being a frequency of a signal generated by the connection of the first conductor, wherein the reference capacitive load is provided by a reference conductor contained with the cable, the reference conductor not being connected to the source.

7. The method of claim 6 wherein the selective connection of the reference capacitive load and the selective connection of the first conductor to the oscillator is performed via a multiplexer.

8. The method of claim 6 further comprising selectively connecting a second conductor of the at least one conductor of the cable to the oscillator such that a frequency output of the oscillator is a function of a parasitic self-capacitance of the second conductor and comparing a second frequency output the second frequency output being a frequency of a signal generated by the connection of the second conductor, with the reference frequency output and the first frequency output.

9. The method of claim 8 further comprising selectively connecting a third conductor of the at least one conductor of the cable to the oscillator such that a frequency output of the oscillator is a function of a parasitic self-capacitance of the third conductor and comparing a third frequency output, the third frequency output being a frequency of a signal generated by the connection of the third conductor, with the reference frequency output, the first frequency output, and the second frequency output.

* * * * *